United States Patent [19]

Yoshihisa et al.

[11] Patent Number: 4,494,075
[45] Date of Patent: Jan. 15, 1985

[54] VOLUME CONTROL CIRCUIT

[75] Inventors: Kozo Yoshihisa; Isamu Okui, both of Fukaya, Japan

[73] Assignee: Tokyo Shibaura Denki Kabushiki Kaisha, Kawasaki, Japan

[21] Appl. No.: 341,340

[22] Filed: Jan. 21, 1982

[30] Foreign Application Priority Data

Jan. 28, 1981 [JP] Japan .................................. 56-12076

[51] Int. Cl.$^3$ .......................... H03G 3/30; H03F 3/45
[52] U.S. Cl. ..................................... 330/254; 330/257
[58] Field of Search ............... 330/149, 254, 257, 288; 358/27; 179/1 VL

[56] References Cited

U.S. PATENT DOCUMENTS 4,065,725 12/1977 Lillis et al. ........................... 330/254
4,219,781 8/1980 Naokawa ............................. 330/254

Primary Examiner—James B. Mullins
Attorney, Agent, or Firm—Cushman, Darby & Cushman

[57] ABSTRACT

A volume control circuit includes an input circuit, which may be a differential amplifier, for converting an input signal to 1st and 2nd currents. The 1st current contains a 1st signal component and the 2nd current contains a 2nd signal component whose phase is opposite to the phase of 1st signal component. The input circuit is coupled to 1st and 2nd divider circuits which may be a doubly balanced differential amplifier. A volume control signal is applied to the 1st and 2nd divider circuits. The 1st divider circuit divides or attenuates the 1st current according to the volume control signal and generates a 1st divided current. The 2nd divider circuit divides or attenuates the 2nd current according to the volume control signal and generates a 2nd divided current. The current division ratio of each of the 1st and 2nd divider circuits is changed with the magnitude of the volume control signal. The 1st and 2nd divided currents are converted to an output current by a current mirror including inverted Darlington connected transistors. The output current is converted to an output signal by an output circuit.

10 Claims, 3 Drawing Figures

F I G. 3
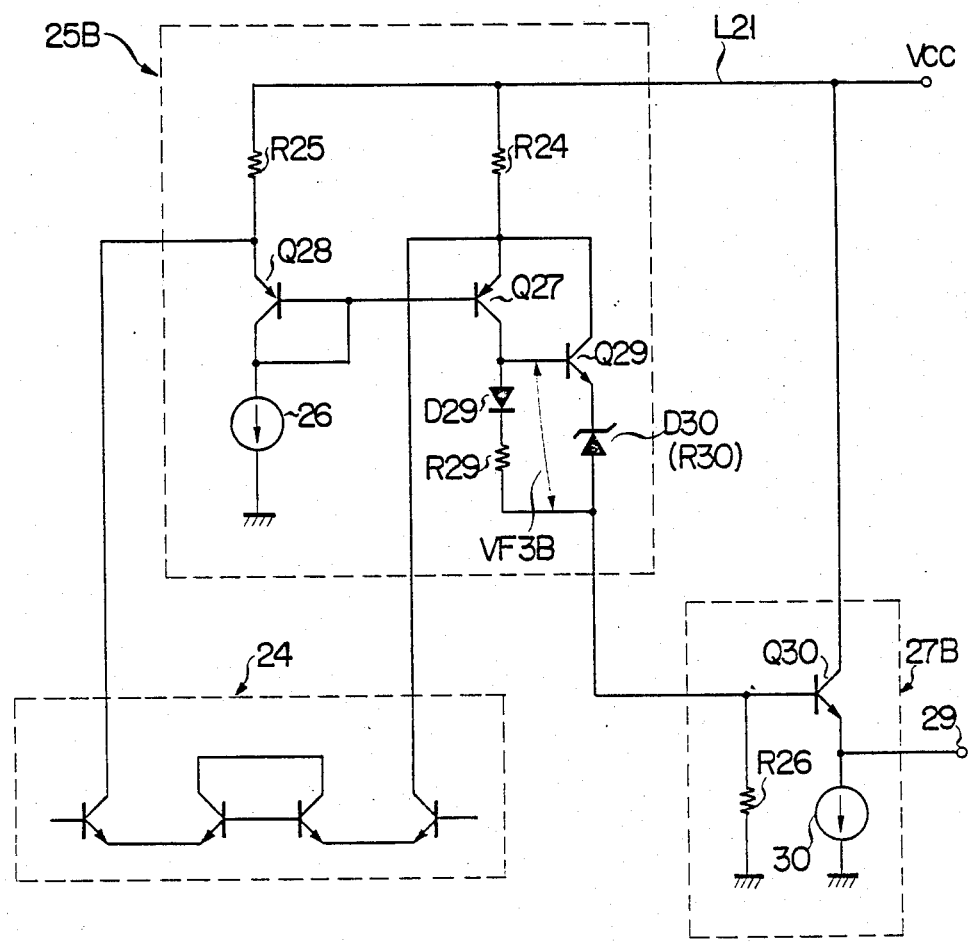

VOLUME CONTROL CIRCUIT

BACKGROUND OF THE INVENTION

This invention relates to a circuit for controlling a signal level and more particularly to a volume control circuit suitable for a low distortion type audio equipment.

Generally, volume control and balance control functions are necessary for an audio equipment, e.g. a radio receiver for stereo broadcasting or a stereophonic playback apparatus. Many control circuits having these functions have been proposed. For such control circuit, it is desirable that the circuit, especially a volume control circuit, has a low distortion characteristic and is suitable for an integrated semiconductor circuit.

FIG. 1 shows a preceding invention of a volume control circuit which is disclosed in a U.S. patent application (U.S. Ser. No. 275,155, filed on June 19, 1981, inventors are the same as that of this application). The present invention has been made for improving this preceding invention, but the preceding one is not a prior art harming the novelty and inventive step of the present invention.

Referring now to FIG. 1, an audio signal Vs at an input terminal 20 is applied to a differential amplifier 21 via a coupling capacitor C21. The differential amplifier 21 comprises first and second transistors Q21 and Q22. The base of first transistor Q21 is connected to the capacitor C21 and to a positive terminal of a fixed DC voltage source V21 through a resistor R21. The negative terminal of voltage source V21 is grounded. The emitter of first transistor Q21 is grounded through a constant current source 22. The base of second transistor Q22 is also connected to the positive terminal of voltage source V21 through a resistor R22. The emitter of second transistor Q22 is grounded through a constant current source 23 and to the emitter of first transistor Q21 through a resistor R23.

The audio signal, after being amplified by the differential amplifier 21, is supplied from the collector of each of first and second transistors Q21 and Q22 to a substantially doubly balanced amplifier 24 which controls the gain of the audio signal. The doubly balanced differential amplifier 24 comprises third to sixth transistors Q23 to Q26. The emitter of third and fourth transistors Q23 and Q24 are connected in common to the collector of first transistor Q21. The emitter of fifth and sixth transistors Q25 and Q26 are connected in common to the collector of second transistor Q22. The base of third and sixth transistors Q23 and Q26 are connected in common to a positive terminal of a variable DC voltage source V22, the negative terminal of which is grounded. The base of fourth and fifth transistors Q24 and Q25 are connected in common to a positive terminal of a fixed DC voltage source V23, the negative terminal of which is grounded.

A controlled audio signal is supplied from the collector of each of third and sixth transistors Q23 and Q26 to a current mirror circuit 25. The collector of fourth and fifth transistors Q24 and Q25 are connected in common to a line L21 of a power supply source Vcc. Accordingly, another controlled audio signal of transistors Q24 and Q25 is bypassed to line L21. The current mirror circuit 25 comprises seventh and eighth transistors Q27 and Q28. The emitter of seventh transistor Q27 is connected to the collector of third transistor Q23 and to line L21 through a resistor R24. The emitter of eighth transistor Q28 is connected to the collector of sixth transistor Q26 and to line L21 through a resistor R25. The base of eighth transistor Q28 is connected to the base of seventh transistor Q27. The collector of eighth transistor Q28 is connected to its base and to the circuit ground through a constant current source 26.

The controlled audio signal is supplied from the collector of seventh transistor Q27 to an output terminal 29. The collector of seventh transistor Q27 is grounded via a resistor R26 which forms a load circuit 27. The controlled audio signal Vo is provided from the output terminal 29 to a loudspeaker (not shown).

The operation of the above described volume control circuit is as follows. When an audio signal having a value Vs is applied to the differential amplifier 21 via input terminal 20 and capacitor C21, the value of the audio signal current flowing through resistor R23 is expressed as follows:

$$i_s = \frac{V_s}{R_a} \tag{1}$$

where Ra is the resistance of resistor R23.

Accordingly, if the current of constant current source 22 is equal to that of constant current source 23 and is expressed as I01, a value of the audio signal current at the collector of first transistor Q21 is (I01+$i_s$) and the value of the audio signal current at the collector of second transistor Q22 is (I01−$i_s$)

The audio signal current from each of first and second transistors Q21 and Q22 is supplied to doubly balanced amplifier 24 to control the gain of the audio signal. The control function of doubly balanced differential amplifier 24 is achieved by adjusting the potential value E22 of voltage source V22 in relation to the potential value E23 of voltage source V23. When value E22 is larger than value E23, and value E22 is increased until third and sixth transistors Q23 and Q26 conduct and fourth and fifth transistors Q24 and Q25 are cut off, the audio signal current from the collector of each of first and second transistors Q21 and Q22 flows only through the collector and emitter path of each of third and sixth transistors Q23 and Q26, respectively. Accordingly, the gain of the audio signal, that is, the volume, is maximized. On the other hand, when value E22 is smaller than value E23, and value E22 is decreased until third and sixth transistors Q23 and Q26 are cut off and fourth and fifth transistors Q24 and Q25 conduct, the audio signal current from the collector of each of first and second transistors Q21 and Q22 flows only through the collector and emitter path of each of fourth and fifth transistors Q24 and Q25, respectively. Accordingly, the gain of the audio signal is minimized.

The maximum gain of the audio signal in the volume control circuit is calculated below. When seventh and eighth transistors Q27 and Q28 constitute current mirror circuit 25 having a current ratio 1, the value of the controlled audio signal current flowing through resistor R24 is equal to that of the controlled audio signal current flowing through resistor R25, where the resistance of resistor R24 is equal to that of resistor R25. That is, $$I02+I01-i_s=Ic+I01+i_s \tag{2}$$

where I02 is the current of constant current source 26 and Ic is the controlled audio signal current supplied from the collector of seventh transistor Q27.

From the equation (2), Ic can be calculated as follows:

$$Ic = I02 - 2i_s \quad (3)$$

Accordingly, the output voltage Vo of the controlled audio signal at output terminal 29 is expressed as follows:

$$Vo = (I02 - 2i_s)(Rb), \quad (4)$$

where Rb is the resistance of resistor R26.

The AC component of the output voltage Vo is as follows:

$$Vo = (2i_s)(Rb) \quad (5)$$

As a result, the maximum gain $G_{max}$ of the audio signal is expressed as follows:

$$G_{max} = \frac{Vo}{Vs} = 2\frac{Rb}{Ra} \quad (6)$$

In the above circuit, the volume control is not influenced by fluctuations in the power source Vcc. Even if the power source in line L21 includes a fluctuation component such as a ripple, the bias voltage across the base and emitter of each of seventh and eighth transistors Q27 and Q28 is unvaried because seventh and eighth transistors Q27 and Q28 constitute the current mirror circuit 25 with constant current source 26. Accordingly, the controlled audio signal from the collector of seventh transistor Q27 does not include the fluctuation element or ripple of power source Vcc. The volume control circuit also does not generate an audio component when the volume control is adjusted to the minimum. Since both the collectors of fourth and fifth transistors Q24 and Q25 are connected to line L21, the controlled audio signal current flowing through the collector and emitter path of each of fourth and fifth transistors Q24 and Q25 is completely bypassed to line L21. Further, when the volume control circuit is integrated into a semiconductor, and the circuit ground is connected through a common ground line to the outside of the semiconductor, the current flowing from the constant current sources 22 and 23 into the ground line is unvaried and is independent of the audio input signal. Accordingly, the potential in the circuit ground line does not fluctuate. As a result, the volume control circuit does not generate an audio component when the volume is minimum.

The circuit of FIG. 1 has advantagious features as mentioned. However, as to the distortion characteristic, there is a possibility of improvement. That is, since the both emitter currents of transistors Q27 and Q28 forming current mirror circuit 25 are varied with the change of signal current $i_s$, the base-emitter voltage VF of each of transistors Q27 and Q28 is subjected to vary with the change of $i_s$. Accordingly, the current flowing through load resistor R26 contains not only the current $i_s$ but a noise current caused by the $i_s$ change. Thus, the distortion factor of output signal obtained from terminal 29 is liable to somewhat worsen due to the noise current.

SUMMARY OF THE INVENTION

It is accordingly an object of this invention to provide a volume control circuit whose distortion factor is not worsened by the change of signal current.

It is an additional object of this invention to provide a volume control circuit whose output signal is not influenced by the fluctuation in a power supply line.

According to the present invention, a volume control circuit includes an input circuit, which may be a differential amplifier, for converting an input signal (Vs) to 1st and 2nd currents. The 1st current ($I01 + i_s$) containes a 1st signal component ($+i_s$) and the 2nd current ($I01 - i_s$) contains a 2nd signal component ($-i_s$) whose phase is opposite to the phase of 1st signal component. The input circuit is coupled to 1st and 2nd divider circuits which may be a doubly balanced differential amplifier. A volume control signal (E22-E23) is applied to the 1st and 2nd divider circuits. The 1st divider circuit divides or attenuates the 1st current according to the volume control signal and generates a 1st divided current ($\alpha(I01+i_s)$). The 2nd divider circuit divides or attenuates the 2nd current according to the volume control signal and generates a 2nd divided current ($\alpha(I01-i_s)$). The current division ratio ($\alpha$) of each of the 1st and 2nd divider circuits is changed with the magnitude of the volume control signal. The 1st and 2nd divided currents are converted to an output current (Ic) by a current mirror including inverted Darlington connected transistors (Q27, Q29). The output current is converted to an output signal (Vo) by an output circuit.

The current mirror includes, for example, 1st and 2nd PNP transistors (Q27, Q28), a 3rd NPN transistor (Q29) and a current feeder (26) which may be a resistor with high resistance or a constant current source, and preferably an impedance element (R29) is coupled between the base and emitter of 3rd transistor (Q29). The emitters of 1st and 2nd transistors (Q27, Q28) are coupled to the 1st and 2nd divider circuit (Q23, Q26), respectively. The base of 1st transistor (Q27) as well as the base and collector of 2nd transistor (Q28) are coupled via the current feeder (26) to the other reference potential line, or a circuit ground. The emitter and collector of 1st transistor (Q27) are connected to the collector and base of 3rd transistor (Q29), respectively. The emitter of 3rd transistor (Q29) provides the output current (Ic).

The 1st and 2nd transistors (Q27, Q28) form a current mirror circuit, and the 1st and 3rd transistors (Q27, Q29) form an inverted Darlington circuit. According to the operation of the inverted Darlington circuit, the output signal (Vo) is not subjected to a distortion due to the variation of base-emitter voltages (VF) of the current mirror transistors, whose variation will be caused by the change of signal current ($i_s$). Further, according to the operation of the current mirror circuit, the output signal (Vo) is not influenced by the fluctuation in the power source line (Vcc).

BRIEF DESCRIPTION OF THE DRAWINGS

FIG. 3 is a modification of FIG. 2.

DETAILED DESCRIPTION OF THE PREFERRED EMBODIMENTS

Before proceeding with the description of the embodiments of the invention, it will be understood that like reference symbols are used to designate like portions throughout the drawings for simplicity of illustration and that the components designated by like reference symbols may be replaced with each other or one another with minor change thereof by a skilled person in the art. An embodiment of a volume control circuit according to the invention will be described.

Figure 1:
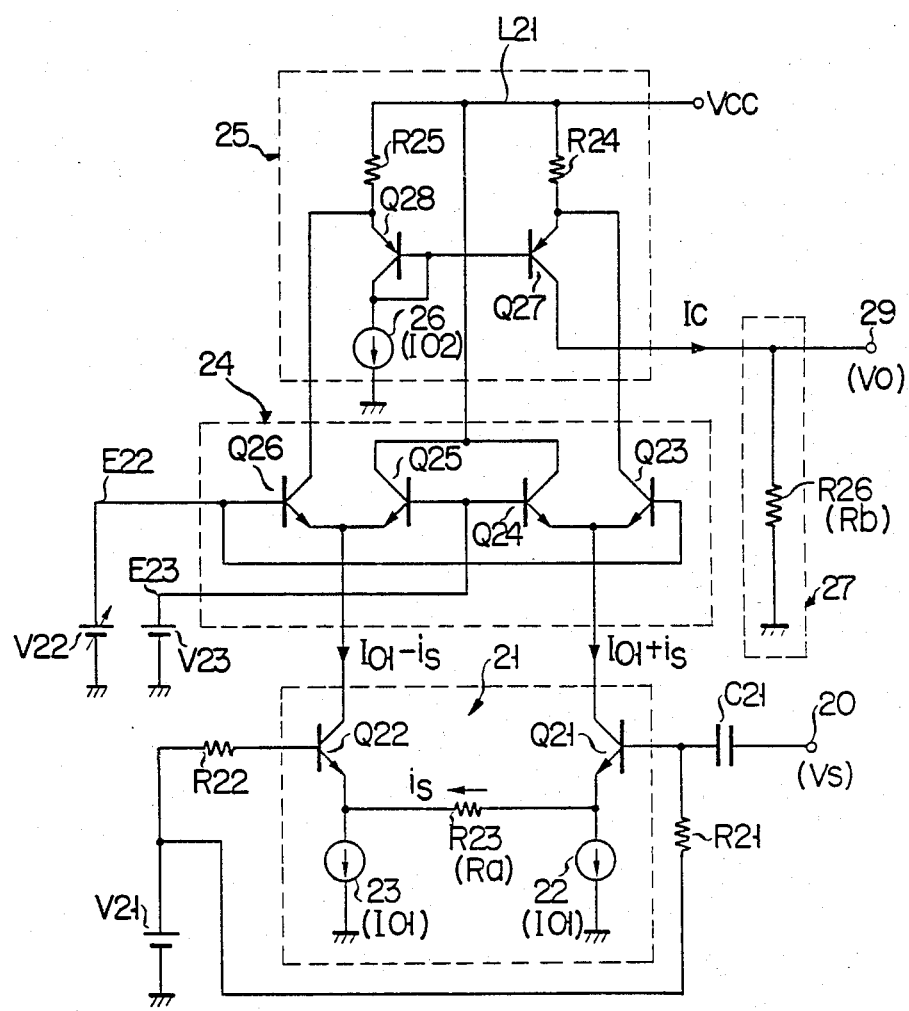
FIG. 1 is a circuit diagram of a volume control circuit according to a preceding invention made by the same inventors as that of this invention.
Figure 2:
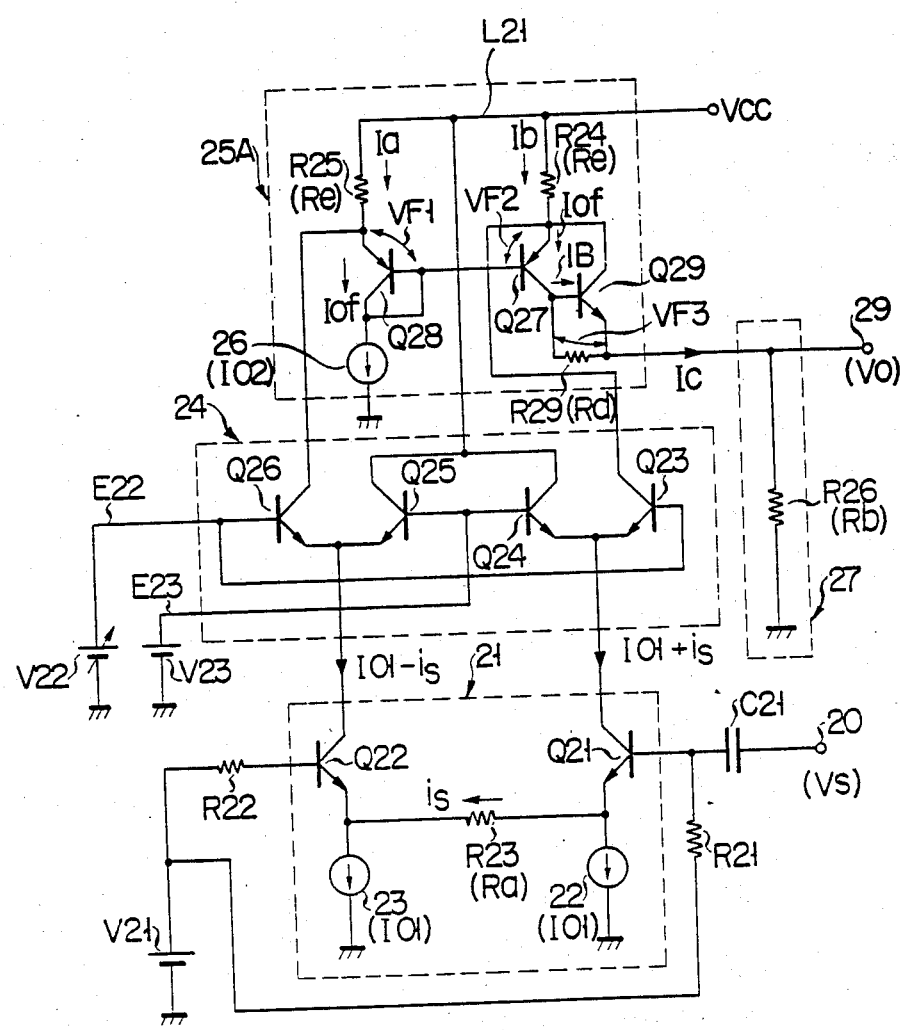
FIG. 2 is a circuit diagram of a volume control circuit according to the present invention.

FIG. 2 shows a volume control circuit of the present invention. Explanations already mentioned will be omitted by using the same reference symbols. In the embodiment of FIG. 2, only the configuration of current mirror circuit 25A differs from that of current mirror circuit 25 shown in FIG. 1. Current mirror circuit 25A includes 1st and 2nd transistors Q27 and Q28 of PNP type and a 3rd transistor Q29 of NPN type. The emitter of 1st transistor Q27 is coupled to the collector of NPN transistor Q23 and to a reference potential line L21 of power source Vcc via a resistor R24. The emitter of 2nd transistor Q28 is coupled to the collector of NPN transistor Q26 and to line L21 through a resistor R25. NPN transistors Q23 and Q24 of a differential amplifier constitute a 1st divider circuit. NPN transistors Q25 and Q24 of a differential amplifier constitute a 2nd divider circuit. The 1st and 2nd divider circuits (Q23–Q24) form the substantially doubly balanced differential amplifier 24.

The base and collector of 2nd transistor Q28 are coupled through a current feeder 26 to the other reference potential line (GND), or the base and collector are grounded via a constant current source 26. The base of 1st transistor Q27 is connected to the base of 2nd transistor Q28. Thus, 1st and 2nd transistors Q27 and Q28 form a current mirror circuit.

The collector and emitter of 1st transistor Q27 are connected to the base and collector of 3rd transistor Q29, respectively. The base of 3rd transistor Q29 is coupled to its emitter through an impedance element or resistor R29. The 1st and 2nd transistors Q27 and Q29 form an inverted Darlington circuit which is the key of this invention. The emitter of 3rd transistor Q29 provides a load resistor R26 of output circuit 27 with an output current Ic. Resistor R26 generates an output signal Vo being proportional to the output current Ic. The output signal Vo is outputted through an output terminal 29 to an external equipment (not shown).

How the distortion of volume control circuit is suppressed will be apparent from following description.

Assume now that the currents flowing through resistors R25 and R24 are Ia and Ib, respectively, that the resistance of each of resistors R25 and R24 is Re, and that the base-emitter voltage of transistors Q28 and Q27 are VF1 and VF2, respectively. Then, the following relation is obtained.

$$IaRe + VF1 = IbRe + VF2$$
$$\therefore VF1 - VF2 = (Ib - Ia)Re \quad (7)$$

Further assume that the feeding current of each of current sources 22 and 23 is I01, that the feeding current of current source 26 is I02, and that the current flowing through resistor R26 whose resistance is Rb is Ic. Then, when the transistors Q24 and Q25 are cut off (the maximum gain state), the followings are established.

$$Ib = Ic + I01 + i_s \quad (8)$$

$$Ia = I02 + I01 - i_s \quad (9)$$

And further assume that symbols k, T and q denote Boltzmann's constant, absolute temperature and the charge of electron, respectively, and K=kT/q, that the saturation current of each of transistors Q27 and Q28 is Is, that the emitter currents of respective transistors Q27 and Q28 are I0f, and that I0f is substantially the same as I02, i.e. I0f~I02. Then, the followings are obtained.

$$VF1 = K\{\ln I0f/Is\} \sim K\{\ln I02/Is\} \quad (10)$$

$$VF2 = K\{\ln I0f/Is\} \quad (11)$$

Subtracting eq. (9) from eq. (8), $Ib - Ia = Ic - I02 + 2i_s$ (12)

is obtained.
Subtracting eq. (11) from eq. (10), $$VF1 - VF2 = K\{\ln I02/Is - \ln I0f/Is\} \quad (13)$$

is obtained.
Substituting eqs. (12) and (13) into eq. (7), $$K\{\ln I02/Is - \ln I0f/Is\} = (Ic - I02 + 2i_s)Re$$

is led. Thus, the following equation is obtained.

$$Ic = I02 - 2i_s + \frac{K}{Re}\{\ln I02/Is - \ln I0f/Is\} \quad (14)$$

Since the output signal voltage Vo is IcRb, the following is obtained from eq. (14).

$$Vo = IcRb = (I02 - 2i_s)Rb + K\frac{Rb}{Re}\{\ln I02/Is - \ln I0f/Is\} \quad (15)$$

Here, suppose that the base current of transistor Q29 is IB, the current amplification factor $h_{FE}$ of transistor Q29 holds $h_{FE} \gg 1$, the base-emitter voltage of transistor Q29 is VF3, and the resistance of resistor R29 is Rd. Then, $$I0f = IB + VF3/Rd \sim VF3/Rd \quad (16)$$

is established. Eq. (16) is obtained from the circuit operation of transistors Q27 and Q29.
Substituting eq. (16) into eq. (15), $$Vo \sim -2Rbi_s + I02Rb + K\frac{Rb}{Re}\{\ln I02/Is - \ln VF3/(IsRd)\} \quad (17)$$

is obtained. In eq. (17) the terms I02Rb and $$K\frac{Rb}{Re}\{\ln I02/Is - \ln VF3/(IsRd)\}$$

are DC components, or substantially being independent of $i_s$. Accordingly, an AC component or input signal component of eq. (17) is only $-2Rbi_s$. That is, as to the input signal component (AC), eq. (17) may be rewritten as $$Vo \sim -2Rbi_s \quad (18)$$

From eqs. (1) and (18) the AC maximum gain of FIG. 2 circuit is $$G_{max} = \left| \frac{V_o}{V_s} \right| \sim 2 \frac{Rb}{Ra} \quad (19)$$

Eq. (19) has the same form as that of eq. (6). Thus, the volume control function of FIG. 2 circuit is the same as that of FIG. 1 circuit.

Note here, as seen from eq. (17), the output signal voltage Vo is not influenced by the change of VF1 and VF2 which will be caused by the change of $i_s$. Therefore, the distortion of FIG. 2 circuit caused by the $i_s$ change can be avoided especially by the combination of current mirror circuit (Q27, Q28) and inverted Darlington circuit (Q27, Q29).

FIG. 3 shows a modification of FIG. 2 circuit. In FIG. 3, a current mirror circuit 25B includes an impedance element being formed of a diode D29 and a resistor R29, and a Zener diode D30. Diode D30 is used for increasing a voltage VF3B which corresponds to VF3 of FIG. 2. The circuit components Q29, D29, D30 and R29 form a sort of current mirror circuit. The current ratio of this current mirror or the ratio between the collector currents of transistors Q27 and Q29 is R29/R30, where R30 denotes the conductive resistance of diode D30, and the area of diode D29 is assumed to be the same as that of the emitter region of transistor Q29. Such current mirror transistor Q29 forms together with the transistor Q27 an inverted Darlington circuit.

An output circuit 27B includes not only a load resistor R26 but also an emitter follower being formed of an NPN transistor Q30 and a current source 30. The emitter follower (Q30, 30) serves as an impedance buffer for coupling an external equipment.

It will be apparent to those skilled in the art that various modifications and variations could be made in the volume control circuit of the invention without departing from the scope of the invention.

What we claim is:

1. A volume control circuit having a pair of reference potential lines, an input terminal and an output terminal, said volume control circuit comprising:
   (a) input means coupled to said input terminal for converting an input signal applied to said input terminal to 1st and 2nd currents, said 1st current containing a 1st signal component and said 2nd current containing a 2nd signal component whose phase has an antiphase relation with the phase of said 1st signal component;
   (b) 1st divider means coupled to said input means and responsive to a volume control signal, for current-dividing said 1st current and providing a 1st divided current, the current division ratio of said 1st divider means being changed with the magnitude of said volume control signal;
   (c) 2nd divider means coupled to said input means and responsive to said volume control signal, for current-dividing said 2nd current and providing a 2nd divided current, the current division ratio of said 2nd divider means being changed with the magnitude of said volume control signal;
   (d) circuit means coupled to said 1st and 2nd divider means for providing an output current corresponding to said 1st and 2nd divided currents, said circuit means including 1st and 2nd transistors of 1st conductivity type, a 3rd transistor of 2nd conductivity type which is opposed to said 1st conductivity type, and a current feeder;

wherein the emitter electrode of said 2nd transistor is coupled to said 2nd divider means and to one of said reference potential line, the base and collector electrodes of said 2nd transistor are coupled through said current feeder to the other of said reference potential lines, the base electrode of said 1st transistor is coupled to the base electrode of said 2nd transistor, the emitter electrode of said 1st transistor is coupled to said 1st divider means and to said one of reference potential line, the collector electrode of said 1st transistor is coupled to the base electrode of said 3rd transistor, the collector electrode of said 3rd transistor is coupled to the emitter electrode of said 1st transistor, the emitter electrode of said 3rd transistor provides said output current;
   and wherein said 1st and 2nd transistors form a current mirror, and said 1st and 3rd transistors form an inverted Darlington; and
   (e) output means coupled to said circuit means and to said output terminal, for converting said output current to an output signal which is obtained from said output terminal.

2. A volume control circuit of claim 1, wherein said circuit means further includes an impedance element coupled between the base and emitter electrodes of said 3rd transistor.

3. A volume control circuit of claim 2, wherein said circuit means further includes a 1st resistor connected between the emitter electrode of said 1st transistor and said one of reference potential lines, and a 2nd resistor connected between the emitter electrode of said 2nd transistor and said one of reference potential lines.

4. A volume control circuit according to any one of claims 1 to 3, wherein said input means includes:
   a 1st input transistor of said 2nd conductivity type whose base electrode is coupled to said input terminal, for outputting said 1st current from the collector electrode thereof;
   a 2nd input transistor of said 2nd conductivity type whose emitter electrode is coupled to the emitter electrode of said 1st input transistor, for outputting said 2nd current from the collector electrode thereof;
   a 1st current source coupled to the emitter electrode of said 1st input transistor and to said other reference potential line, for determining a DC component of said 1st current; and
   a 2nd current source coupled to the emitter electrode of said 2nd input transistor and to said other reference potential line, for determining a DC component of said 2nd current.

5. A volume control circuit according to any one of claims 1 to 3, wherein said 1st divider means includes:
   1st and 2nd dividing transistors of said 2nd conductivity type, both emitter electrodes of said 1st and 2nd dividing transistors receiving said 1st current, both base electrodes thereof receiving said volume control signal, the collector electrode of said 1st dividing transistor outputting said 1st divided current, and the collector electrode of said 2nd dividing transistor bypassing to said one reference potential line a current which corresponds to the difference between said 1st current and said 1st divided current;
   and wherein said 2nd divider means includes:
   3rd and 4th dividing transistors of said 2nd conductivity type, both emitter electrodes of said 3rd and 4th dividing transistors receiving said 2nd current, both base electrodes thereof receiving said volume control signal, the collector electrode of said 4th dividing transistor outputting said 2nd divided current, and the collector electrode of said 3rd dividing transistor bypassing to said one reference potential line a current which corresponds to the difference between said 2nd current and said 2nd divided current.

6. A volume control circuit of claim 4, wherein said 1st divider means includes:

1st and 2nd dividing transistors of said 2nd conductivity type, both emitter electrodes of said 1st and 2nd dividing transistors being coupled to the collector electrode of said 1st input transistor and receiving said 1st current, both base electrodes thereof receiving said volume control signal, the collector electrode of said 1st dividing transistor outputting said 1st divided current, and the collector electrode of said 2nd dividing transistor bypassing to said one reference potential line a current which corresponds to the difference between said 1st current and said 1st divided current;

and wherein said 2nd divider means includes:

3rd and 4th dividing transistors of said 2nd conductivity type, both emitter electrodes of said 3rd and 4th dividing transistors being coupled to the collector electrode of said 2nd input transistor and receiving said 2nd current, both base electrodes thereof receiving said volume control signal, the collector electrode of said 4th dividing transistor outputting said 2nd divided current, and the collector electrode of said 3rd dividing transistor bypassing to said one reference potential line a current which corresponds to the difference between said 2nd current and said 2nd divided current.

7. A volume control circuit having a pair of reference potential lines, an input terminal and an output terminal, said volume control circuit comprising:

a differential amplifier comprising first and second transistor, the emitter electrode of each of said transistors being coupled to one of the reference potential lines, the base electrode of said first transistor being coupled to said input terminal;

a substantially doubly balanced differential amplifier comprising third, fourth, fifth and sixth transistors, the emitter electrodes of said third and fourth transistors being connected in common to the collector electrode of said first transistor, the emitter electrodes of said fifth and sixth transistors being connected in common to the collector electrode of said second transistor, the collector electrodes of said fourth and fifth transistors being coupled in common to the other reference potential line;

a variable reference voltage source having a pair of terminals, one of the terminals being connected to the base electrodes of said third and sixth transistors, the other terminal being coupled to said one reference potential line;

a fixed reference voltage source having a pair of terminals, one of the terminals being connected to the base electrodes of said fourth and fifth transistors, the other terminal being coupled to said one reference potential line;

a current mirror circuit comprising seventh and eighth transistors, the emitter electrode of said seventh transistor being connected to the collector electrode of said third transistor and coupled to said other reference potential line via a resistor, the emitter electrode of said eighth transistor being connected to the collector electrode of said sixth transistor and coupled to said other reference potential line, the base electrodes of said seventh and eighth transistors and the collector electrode of said eight transistor being connected in common; and a distortion suppressing circuit comprising a ninth transistor and a current set impedance, the collector electrode of said ninth transistor being connected to the emitter electrode of said seventh transistor, the base electrode of said ninth transistor being connected to the collector electrode of said seventh transistor, the emitter electrode of said ninth transistor being coupled to said output terminal, and said current set impedance being coupled to the base and emitter electrodes of said ninth transistor.

8. The volume control circuit of claim 7 wherein the emitter electrode of said first transistor of said differential amplifier is connected to the emitter electrode of said second transistor through a resistor and to said one reference potential line through a first constant current source, the emitter electrode of said second transistor being connected to said one reference potential line through a second constant current source.

9. The volume control circuit of claim 7 or 8 wherein the collector electrode of said seventh transistor is connected to said one reference potential line through a resistor.

10. The volume control circuit of claim 7 or 8 wherein the collector electrode of said eighth transistor is connected to said one reference potential line through a third constant current source.

* * * * *